United States Patent [19]
Kanno et al.

[11] Patent Number: 5,812,409
[45] Date of Patent: Sep. 22, 1998

[54] SEMICONDUCTOR DEVICE TRANSPORT SYSTEM WITH DEFORMED TRAY COMPENSATION

[75] Inventors: Yukio Kanno, Ohra-gun; Toshiyuki Kiyokawa, Kuki, both of Japan

[73] Assignee: Advantest Corporation, Tokyo, Japan

[21] Appl. No.: 916,015

[22] Filed: Aug. 21, 1997

[30] Foreign Application Priority Data

Aug. 23, 1996 [JP] Japan .................................. 8-222646

[51] Int. Cl.$^6$ .................................................. G01R 31/28
[52] U.S. Cl. ................... 364/478.01; 324/158.1; 324/758; 324/765; 414/788; 414/795.2
[58] Field of Search .............................. 324/158.1, 758, 324/765; 414/788–795.2; 364/478.01

[56] References Cited

U.S. PATENT DOCUMENTS

| | | | |
|---|---|---|---|
| 5,148,100 | 9/1992 | Sekiba | 324/158 |
| 5,290,134 | 3/1994 | Baba | 414/404 |
| 5,307,311 | 4/1994 | Tani | 324/158 |
| 5,313,156 | 5/1994 | Klug | 324/158 |
| 5,675,957 | 10/1997 | Kim | 53/242 |
| 5,722,514 | 3/1998 | Kiyokawa | 187/270 |

*Primary Examiner*—Emanuel Todd Voeltz
*Assistant Examiner*—Richard H. Musgrove
*Attorney, Agent, or Firm*—Staas & Halsey

[57] ABSTRACT

A semiconductor device transporting and handling apparatus is provided which provides for positively grasping and transporting an IC out of a tray loaded with ICs, even if the tray is tilted due to deformations an/or distortions, by the use of a carrier head which is vertically movable through constant strokes. The tilt of the tray is measured by attitude gauging means comprising four sets of optical sensors, the altitude differences of the top surfaces of ICs accommodated in the tray with respect to a reference level are calculated by altitude difference calculating means, and the calculated altitude differences are stored in altitude difference storage means. Once an IC being picked up has been identified, the altitude difference of the identified IC with respect to the reference level is read out, and the position of the tray is moved vertically to conform with the reference level by altitude difference correcting means to insure that the carrier head can pick up the IC.

11 Claims, 7 Drawing Sheets

SEMICONDUCTOR DEVICE TRANSPORT SYSTEM WITH DEFORMED TRAY COMPENSATION

BACKGROUND OF THE INVENTION

1. Field of the Invention

The present invention relates to a semiconductor device transporting and handling apparatus (commonly called handler) which is suitable for use, in conjunction with a semiconductor device testing apparatus for testing semiconductor devices, for transporting semiconductor devices to be tested to a test section, carrying the tested semiconductor devices out of the test section and sorting them out on the basis of the test results. More particularly, the present invention relates to improvements in the art of taking semiconductor devices loaded on a tray out of the tray by a carrier head.

2. Description of the Related Art

Many of semiconductor device testing apparatus for measuring the electrical characteristics of semiconductor devices by applying a test signal of a predetermined pattern to the semiconductor devices to be tested (commonly called DUT), particularly, many of semiconductor device testing apparatus (commonly called IC tester) for measuring the electrical characteristics of semiconductor integrated circuits (hereinafter referred to as IC) which are typical of the semiconductor devices have a semiconductor transporting and handling apparatus integrally connected thereto. In the following disclosure the present invention will be described by taking ICs typical of semiconductor devices by example for the convenience of explanation.

FIG. 4 illustrates the general construction of one example of the conventional semiconductor device transporting and handling apparatus (hereinafter referred to as handler) called "horizontal transporting system". A plurality of groups 2 of trays each loaded with ICs are disposed on a platform 1 constituting a base along the lower side 1A thereof as viewed in the drawing. Each of the tray groups 2A–2E consists of a number of trays 12 vertically stacked one on another. The leftmost tray group 2A as viewed in the drawing is positioned at a loader section. The trays of the group 2A in the loader section are loaded with ICs to be tested.

X-Y carrier arm means 3A, 3B takes one IC at a time, in this example, out of the uppermost tray of the stacked tray group 2A at the loader section and transports it onto a turntable 4 called "soak stage". A row of positioning recesses 5 for defining the positions for receiving the ICs are formed in the turntable 4 at equal angular intervals on a concentric circle. Each positioning recess 5 is of substantially square shape and is surrounded on four sides by upwardly inclined walls. Each time the turntable 4 rotates by one pitch (a feed angle of one positioning recess 5) in a clockwise direction in the illustrated example, the carrier arm means 3A, 3B drops one IC down into one of the positioning recesses 5. More specifically, the carrier arm 3A, in this example, of the X-Y carrier arm means 3A, 3B has mounted thereto a carrier head 3C which is adapted to grasp one of ICs being tested in the tray 12, so that the grasped IC to be tested is carried out of the tray 12 to the turntable 4 by the movements of the X-Y carrier arm means 3A, 3B in X-Y directions.

The reference numeral 6 denotes rotary arm means called "contact arm" for transferring the ICs conveyed by the turntable 4 to a test section 7. Specifically, the contact arm means 6 is adapted to pick up an IC from each of the positioning recesses 5 in the turntable 4 and transports it to the test section 7. The contact arm means 6 has three arms each having a carrier head attached thereto and performs the operations, by rotation of the three arms, of sequentially transferring the ICs grasped by the carrier heads to the test section 7 and of sequentially transferring the ICs tested in the test section 7 to a transfer arm means 8 located at an exit from the test section.

It should be noted that the turntable 4, the contact arm means 6 and the test section 7 are contained in a constant temperature chamber 9 (commonly called chamber) so that ICs to be tested may undergo the testing within the chamber 9 while being maintained at a predetermined temperature. The interior of the constant temperature chamber 9 is temperature controlled so as to be maintained at a preset high or low temperature to apply a predetermined thermal stress to ICs to be tested.

The transfer arm means 8 on the exit side of the test section has also three arms each having a carrier head attached thereto and is configured to transport the tested ICs grasped by the carrier heads out to an unloader section by rotation of the three arms. ICs taken out of the constant temperature chamber 9 are sorted out on the basis of the test result data and stored in corresponding one of the tray groups 2C, 2D and 2E, three in this example, located in the unloader section. By way of example, non-conforming ICs are stored in a tray of the rightmost tray group 2E, conforming ICs are stored in a tray of the tray group 2D at the left side of the tray group 2E, and ICs which have been determined to need a retest are stored in a tray of the tray group 2C at the left side of the tray group 2D. This sorting is performed by carrier arm means 10A, 10B which is controlled on the basis of the test result data. In this example, the carrier arm 10A has mounted thereto a carrier head 10C which is adapted to grasp one of the tested ICs and transport it to the designated tray 12.

It is noted that the tray group 2B located at the second position from the leftmost side is an empty tray group located at a buffer section for accommodating trays emptied of ICs in the loader section. When the uppermost tray of any one of the tray stacks 2C, 2D and 2E in the unloader section is filled with ICs, a tray of this empty tray group 2B is conveyed to the top of the corresponding tray stack to be used to store ICs therein.

While in the handler illustrated in FIG. 4 the turntable 4 has only one row of positioning recesses 5 spaced at equal angular intervals for defining the positions for receiving the ICs formed therein on a concentric circle such that each time the turntable 4 rotates by one pitch in a clockwise direction the carrier arm means 3A, 3B deposits one IC into one of the positioning recesses 5, another type of handler as shown in FIG. 5 is also in practical use in which the turntable 4 has two rows of angularly equally spaced apart positioning recesses 5 formed therein on concentric circles. The arrangement in the latter case is such that the X-Y carrier arm means 3A, 3B transports two ICs being tested at a time from a tray located in the loader section and deposits the two ICs into corresponding two of the positioning recesses 5 of the two rows with each incremental (one pitch) rotation of the turntable 4.

The handler as illustrated in FIG. 5 is identical to that shown in FIG. 4 except that the contact arm means 6, the transfer arm means 8 at the exit side and the carrier arm means 10 are adapted to handle two ICs at a time and that the test section 7 is also configured to conduct examination on two ICs at a time. Accordingly, the corresponding parts of the FIG. 5 configuration are indicated by the like reference numerals and will not be further described.

Further, the handler of the horizontal transporting system as illustrated as a flow chart manner in FIG. 6 has also been in practical use in which ICs 56 under test which have been beforehand loaded on a customer tray (user tray) 12 in a loader section 51 by a user are transferred and reloaded onto a test tray 53 capable of withstanding high/low temperatures. The test tray 53 is then moved in a circulating manner from and back to the loader section 51 sequentially through the constant temperature chamber 9 and an unloader section 52. Specifically, a test signal of a predetermined pattern is applied to the ICs 56 under test placed on the tray 14 in the testing section 7 within the constant temperature chamber 9 to be measured for their electrical characteristics. Upon completion of the measurement, the tested ICs carried on the test tray 53 are transported from the test section 7 to the unloader section 52 where the tested ICs are sorted out based on the data of the test results and transferred from the test tray 53 onto the corresponding customer trays 12.

In the handler of the construction shown in FIG. 6 as well, X-Y carrier arm means constructed similarly to the X-Y carrier arm means 3A, 3B used in the handler of the construction shown in FIGS. 4 and 5 is employed to transfer ICs to be tested from the customer tray 12 to the test tray 53 in the loader section. Likewise, in the unloader section, X-Y carrier arm means constructed similarly to the X-Y carrier arm means 10A, 10B is employed to transfer tested ICs from the test tray 53 to the customer tray 12 in the unloader section.

It is noted in FIG. 6 that a chamber 54 called soak chamber where ICs to be tested placed on the test tray 53 are heated or cooled to a predetermined temperature and a chamber 55 called exit chamber where the tested ICs are restored to the ambient temperature are disposed on the inlet side and the outlet side, respectively, in the constant temperature chamber 9. Generally, both the soak chamber 54 and exit chamber 55 are configured to store a plurality of (say, ten) test trays 53 stacked one on another.

The individual trays 12 of the tray groups 2A–2E used in the handler of the construction as illustrated in FIGS. 4 and 5 are identical to the trays 12 used by the user to place ICs to be tested and the trays 12 used to store tested ICs in the handler of the construction as illustrated in FIG. 6. They are known as customer tray or user tray in the art. These trays 12 are molded from resin. That is, they are resin molded parts. It is known that resin molded parts have drawbacks that they are susceptible to deformations such as warpage due to changes with time and variations in temperature as well as being liable to be distorted during the molding.

The customer tray 12 is a container having a multiplicity of recessed pockets arrayed in the form of a grate for accommodating ICs. The customer tray 12 with ICs stored in its pockets is rested on a tray stand in the loader section. The tray stand is supported on its bottom by a vertically movable elevator so that the tray 12 carried on the tray stand is lifted up to a predetermined elevation or level by the elevator. It should be understood that in the handler constructed as illustrated in FIGS. 4 and 5 customer trays 12 with ICs stored in their pockets are often placed as a vertical stack on the tray stand, whereas in the handler constructed as illustrated in FIG. 6, a single customer tray 12 rather than a stack of trays is often supported on the tray stand.

If there is some deformation in the tray 12, it will be tilted upon being rested on the tray stand, resulting in differences of altitude on the IC supporting surface of the tray. In other words, some ICs are placed at relatively low levels (IC supporting surfaces) of the tray while some ICs are placed at relatively high levels (IC supporting surfaces) of the same tray.

On the other hand, the carrier head of the X-Y carrier arm for grasping and carrying an IC to be tested from the tray 12 in the loader section is adapted to be lowered through a predetermined stroke (distance) by an elevator, not shown, to attract and grasp the IC in the tray 12 by means of a pick-up head (usually, vacuum pick-up head) mounted to the carrier head.

It has been a practice in the prior art as illustrated in FIG. 7 as an example to dispose a light transmitting type sensor for detecting the top of a tray 12 at a predetermined position above a tray stand 61 with the light emitting element (photoemissive device) 62 and light receiving element 63 positioned in horizontally opposed relation, the arrangement being such that the position of the top of the tray 12 supported on the tray stand 61 is detected by the top of the tray 12 intercepting the light from the light emitting element 62 as the tray 12 is lifted by an elevator 64 whereupon the elevator 64 is halted in response to the detection signal to stop the movement of the tray stand 61 to thereby stop the tray 12 at a predetermined position.

With the construction described above, however, if the tray 12 is deformed (hence tilted) as shown in FIG. 8, the top of the tray 12 is not flat in that a portion (lefthand portion as viewed in the drawing) of the tray top is lifted up from the surface of the tray stand 61 as shown by an arrow 96, for instance. As a result, since the left end of the tray top is positioned at a higher level than it would be normally (when not deformed) as shown by an arrow 97, the sensor will detect the top of the tray 12 earlier than normally, so that the tray stand 61 is halted at a position lower than the normal stop position.

Consequently, in the case where the carrier head 3C is equipped with two or more pick-up heads as in the handlers as illustrated in FIGS. 5 and 6, when the carrier head is depressed through a predetermined stroke by lift means, some (designated at 91a, for example in FIG. 8) of the pick-up heads may almost normally pick up ICs in the tray 12, but there arises the trouble that some (designated at 91b, for example in FIG. 8) of the pick-up heads may not successfully pick up ICs in the tray 12. Further, in the case where the carrier head 3C is equipped with a single pick-up head as in the handler illustrated in FIG. 4 as well, the pick-up head may pick up ICs placed at relatively high levels in the tray 12, but not ICs placed at relatively low levels since the downward stroke of the carrier head 3C.

As discussed above, if the tray 12 is placed slantingly on the tray stand, the gap between the tip of the carrier head and the top surface of the IC being tested (actually the top surface of the IC package) rested on the tray will vary depending upon where on the tray the particular IC is located, because the stroke of the vertical movements of the carrier head is constant. As a result, the carrier head may sometimes be unsuccessful in picking up an IC placed at a relatively lower level on the tray because of failure to reach the IC.

In the handlers constructed as illustrated in FIGS. 4 and 5 in which a tray group 2A comprising a number of trays 12 stacked one on another is placed on the tray stand in the loader section and ICs are picked up from the uppermost tray 12 by the carrier head of the X-Y carrier arm means 3A, 3B, if there is more or less deformation in each tray, the altitude differences of all trays, in the worst case, would be cumulatively added up, so that the tray located at the higher tier would have a greater slant. Consequently, the aforesaid drawbacks would become more striking.

In an attempt to overcome the foregoing drawbacks, it has heretofore been a practice to move the elevator 64 by an extra distance after being stopped at a preset position to lift the tray stand 61 further upwardly so that the carrier head 3C may reach all of the ICs to be tested on the tray 12. Although this arrangement has enabled the carrier head 3C to pick up all of the ICs being tested on the tray 12, the drawback has still remained that ICs to be tested placed at relatively high levels on the tray 12 are apt to be damaged or broken due to collision with the carrier head or to accidentally shift an other IC to be tested out of place due to a shock.

For this reason, a handler has been provided in which a small mass IC suction pad is mounted to the tip of the pick-up head for limited vertical movements so that variations in the distance from the stop position of the pick-up head to the top surface of the IC may be accommodated by the vertically variable stroke of the suction pad.

However, when there are large deformations in the tray 12, the ICs stored in the tray are quite often accompanied with so large differences of altitude generated depending on the positions of the ICs in the tray that cannot be accommodated by the limited variable stroke of the pick-up head. In addition, in the case of the tray group comprising a number of trays stacked in tiers, the tilt of the uppermost tray is cumulatively augmented as discussed above, the problem remained that the difference of elevation was far too great for the limited variable stroke of the suction pad to take up.

In view of this, it has also been proposed to equip the pick-up head with a distance measuring sensor for measuring a distance by projecting a laser beam. The distance measuring sensor is adapted to detect the distance between the top face of the IC being picked up and the pick-up head to provide for correcting the level of the pick-up head so as to maintain the distance constant to thereby permit the pick-up head to always attract ICs with a constant stroke.

This system, however, requires the use of expensive sensors, undesirably resulting in an great increase in the initial cost.

SUMMARY OF THE INVENTION

It is an object of the present invention to provide a semiconductor device transporting and handling apparatus which is capable of positively grasping semiconductor devices placed on a tray and transporting them, even if the tray is deformed or tilted.

According to the present invention, the foregoing object is accomplished by providing a semiconductor device transporting and handling apparatus in which a carrier head grasps one or more semiconductor devices out of a tray loaded with a plurality of semiconductor devices and transports it or them to a desired location, the apparatus comprising: an attitude gauging means for measuring the attitude of the tray; an altitude difference calculating means for calculating the differences between the levels of the plurality of semiconductor devices loaded on the tray and a reference altitude value on the basis of the attitude values determined by the attitude gauging means; an altitude difference storage means for storing the altitude differences calculated by the altitude difference calculating means between the levels of the semiconductor devices and the reference altitude value; means for reading the altitude difference of a particular semiconductor device to be transported by the carrier head with respect to the reference altitude value out of the altitude difference storage means once the particular semiconductor device has been identified; and an altitude difference correcting means for correcting the level of the identified semiconductor device so as to be equal to the reference altitude value on the basis of the attitude difference of the device with respect to the reference altitude value as read out of the altitude difference storage means.

The tray is supported on a vertically movable tray stand, and the altitude difference correcting means is configured to actuate an elevator means for moving the tray stand vertically to correct the level of the identified semiconductor device on the tray so as to conform with the reference altitude value, on the basis of the attitude difference with respect to the reference altitude value read out of the altitude difference storage means.

In a preferred embodiment, a tray group consisting of a number of trays vertically stacked in tiers, each tray carrying a plurality of semiconductor devices thereon is supported on a vertically movable tray stand. The carrier head is adapted to transport semiconductor devices placed on the uppermost tray to the desired location, and the altitude difference correcting means being configured to actuate an elevator means for moving the tray stand vertically to correct the level of the identified semiconductor device on the uppermost tray so as to conform with the reference altitude value, on the basis of the attitude difference with respect to the reference altitude value as read out of the altitude difference storage means.

The attitude gauging means comprises four sets of optical sensors, each set including a light emitting element and a light receiving element which are located in preselected positions so as to be able to detect the level of the associated one of the four corners of the uppermost tray of the tray group on the tray stand.

The attitude gauging means is adapted to detect, in the course of the tray stand being moved by the elevator means to lift the tray group on the tray stand, the order in which the four corners of the uppermost tray of the tray group intercept the light ray radiated from the light emitting elements of the corresponding optical sensors and to determine the distances travelled by the tray in its upward movement from the first interception of light to the second interception, from the second to third interceptions, and from the third to fourth interceptions.

The carrier head is equipped with one or more pick-up heads which are each configured to attract and grasp the semiconductor devices in the tray for transportation. The pick-up head further has a suction pad mounted to the lower portion thereof for vertical movements, and the altitude difference correcting means is configured to correct the level of the identified semiconductor device placed in the tray so as to conform with the reference altitude value on the basis of the attitude difference with respect to the reference altitude value read out of the altitude difference storage means so that the forward end of the suction pad comes into contact with the top surface of the identified semiconductor device in the when the carrier head is lowered by a predetermined distance to pick up the identified semiconductor device in the tray.

Alternatively, the altitude difference correcting means may be configured to correct the level of the identified semiconductor device placed in the tray so as to conform with the reference altitude value on the basis of the attitude difference with respect to the reference altitude value read out of the altitude difference storage means so that the forward end of the pick-up head comes into slight contact with the top surface of the identified semiconductor device in the tray when the carrier head is lowered by a predetermined distance to pick up the identified semiconductor device in the tray.

In a modified embodiment, the attitude gauging means may comprise three sets of optical sensors, two of the optical sensor sets including light emitting elements and light receiving elements which are located in preselected positions so as to be able to measure the levels of two diagonally opposed corners of the tray while the remaining one set includes a light emitting element and a light receiving elements which are located in preselected positions so as to be able to measure the level of the tray as viewed in a direction passing through about the center of the tray and substantially perpendicular to the two opposed sides of the tray.

DETAILED DESCRIPTION OF THE PREFERRED EMBODIMENTS

Figure 1:
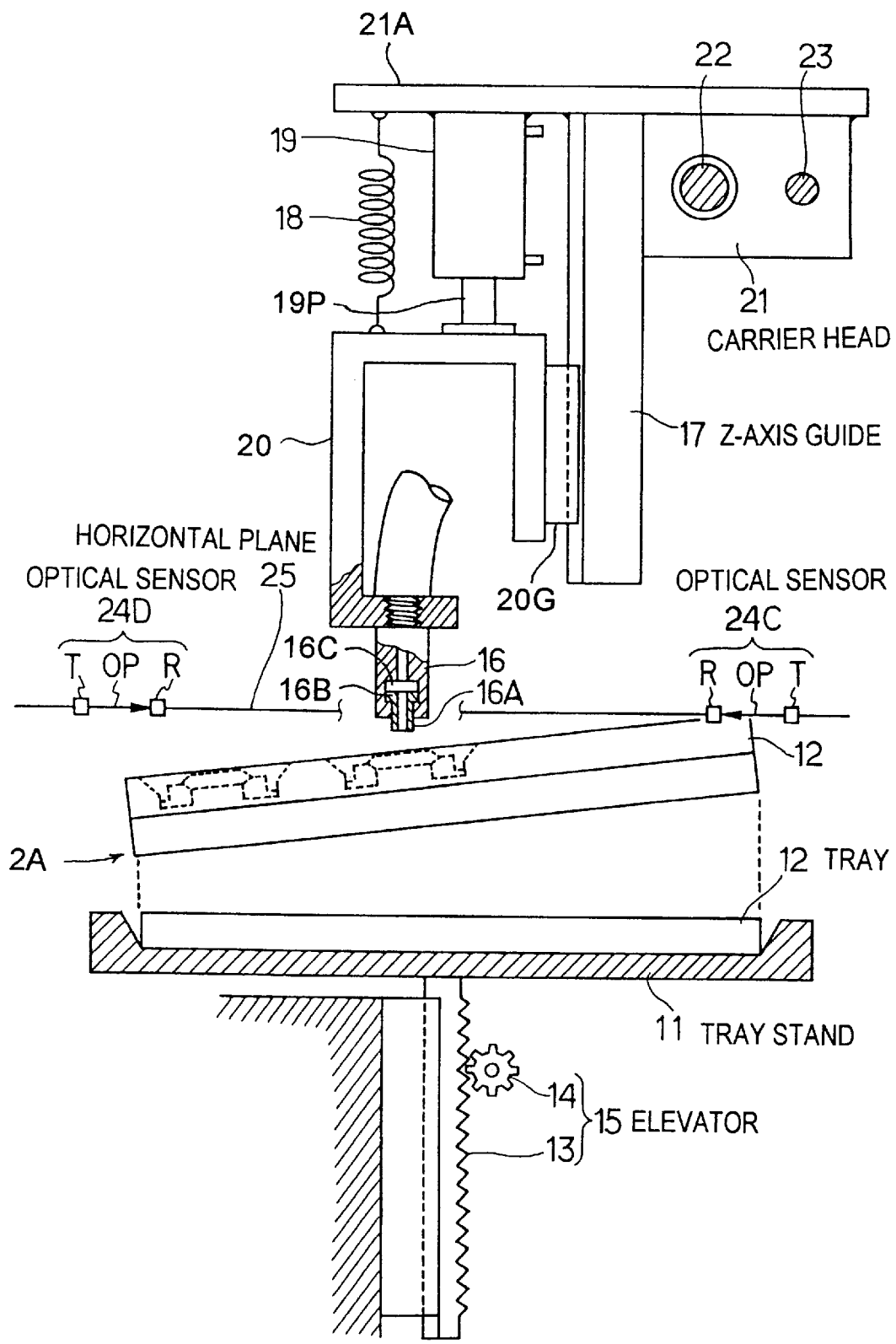
FIG. 1 is a schematic side view, partly in cross-section, illustrating the construction of the principal parts of an embodiment of the semiconductor device transporting and handling apparatus according to the present invention.

FIG. 1 is a side view, partly shown in cross-section, illustrating the construction of the principal parts of an embodiment of the semiconductor device transporting and handling apparatus (handler) according to the present invention. This is an example in which the invention is applied to the semiconductor device transporting and handling apparatus of the type shown in FIG. 4.

A tray group consisting of a number of trays 12 vertically stacked in tiers is deposited on a tray stand 11 which is in turn supported for vertical movements by an elevator 15 comprising a rack 13 and pinion 14, for example. Specifically, the tray stand 11 is configured to be lifted by one tray height each time the uppermost tray 12 of the tray stack supported on the tray stand 11 is removed as all of the ICs loaded on that tray have been taken out, whereby the uppermost tray 12 of the tray group may be always maintained at the fixed position.

Figure 4:
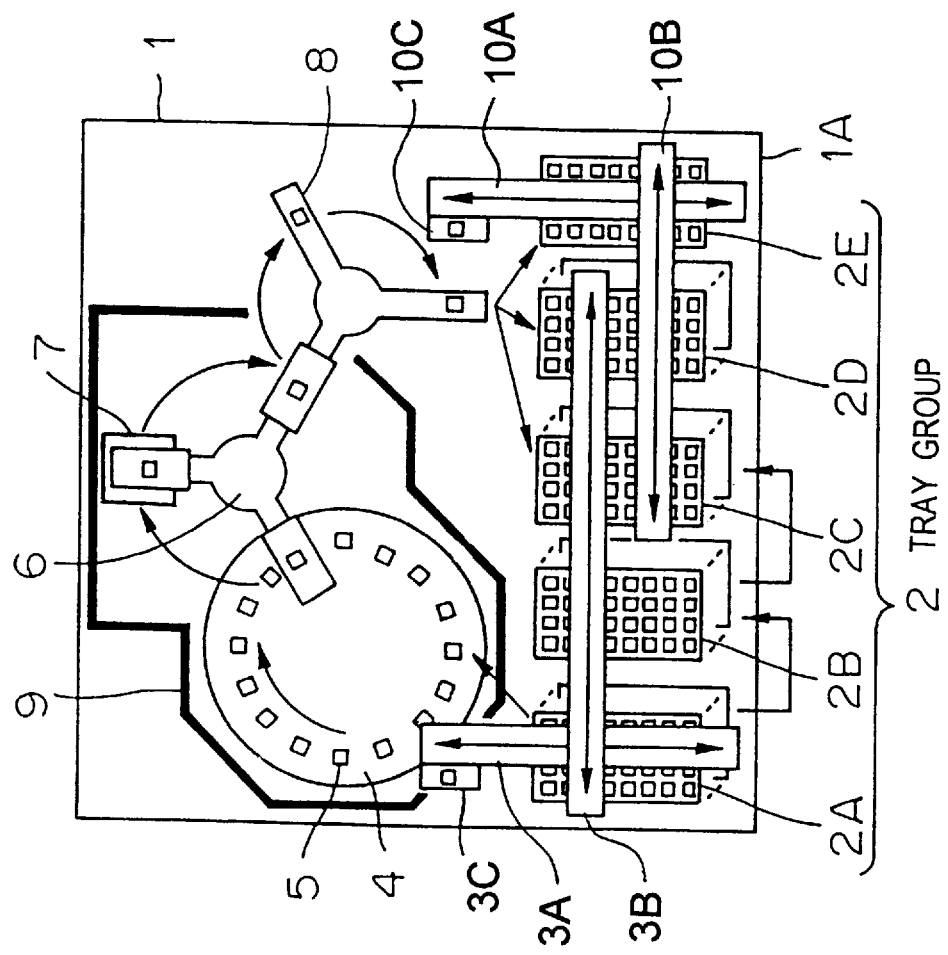
FIG. 4 is a plan view illustrating an example of the conventional semiconductor device transporting and handling apparatus to which the present invention may be suitably applied.
Figure 5:
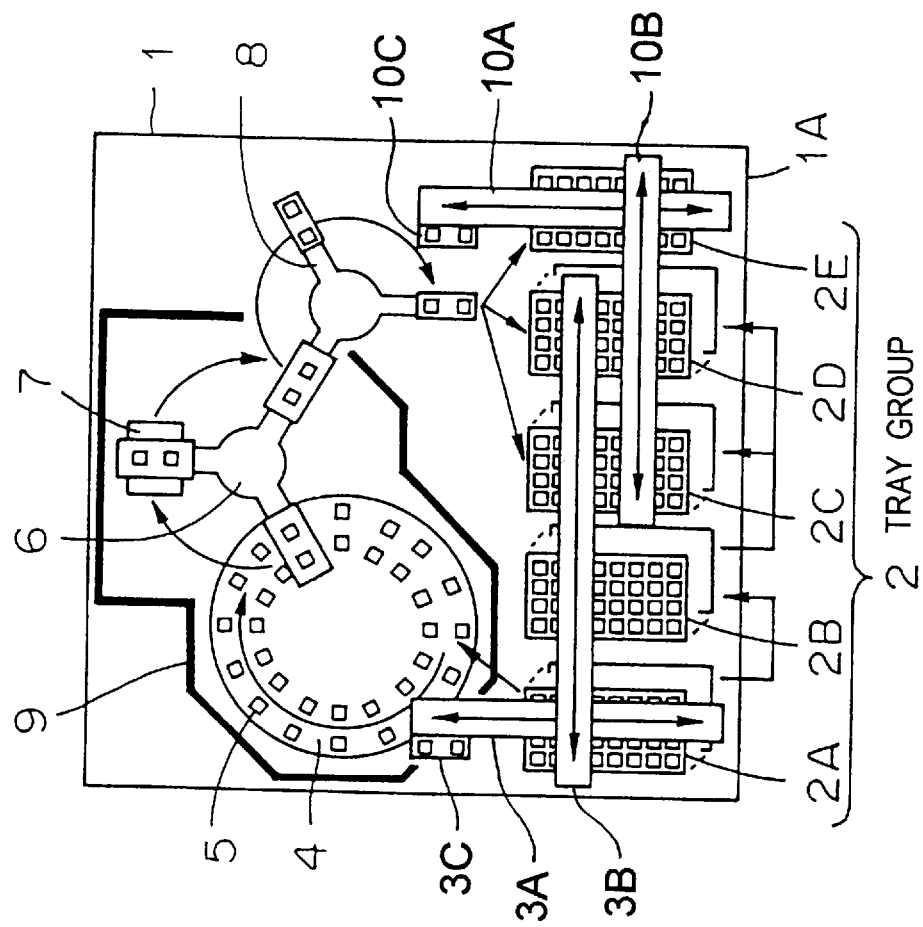
FIG. 5 is a plan view illustrating another example of the conventional semiconductor device transporting and handling apparatus to which the present invention my be suitably applied.

Above the tray stand 11 is disposed a carrier head 21 (corresponding to the carrier head 3C of the handler shown in FIGS. 4 and 5) movable in X-Y directions. Extending from the top of the carrier head 21 is an arm 21A to the underside of which an air cylinder 19 is secured. The air cylinder 19 is connected with a supply of pressurized air, not shown, and includes a piston rod 19P the distal end of which is fixed to the top of a pick-up head support 20 so that actuation of the air cylinder 19 may cause the piston rod 19P to lower the pick-up head support 20 by a fixed distance.

Mounted to the bottom of the pick-up head support 20 is one pick-up head 16 in this example. While the pick-up head 16 is of the type attracting and grasping an object by the action of vacuum in this example, it is possible to employ any other type of pick-up head utilizing means other than vacuum to attract and grasp an object. The pick-up head support 20 is vertically moved in the Z-axis direction (vertically) in a stable manner by the actuation of the air cylinder 19 by virtue of a guide member 20G extending one side of the support 20 and slidably engaged with a vertically extending Z-axis guide 17.

A spring 18 is disposed between and connected to the underside of the arm 21A of the carrier head 21 and the top of the pick-up head support 20 to normally bias the support 20 upwardly. It is thus to be understood that upon the air cylinder 19 being deactuated after the pick-up head support 20 is lowered by a preset distance by the actuation of the air cylinder 19 to permit the pick-up head 16 to engage with the top surface of an IC under test in the tray 12 and pick it up, the pick-up head support 20 is raised up to the original position under the tension of the spring 18 to thereby allow the IC grasped by the pick-up head 16 to be taken out of the tray 12.

While a vertically movable suction pad 16A is mounted to the lower end of the pick-up head 16 in the embodiment illustrated, such suction pad may be omitted. The suction pad 16A is formed of rubber or metal, for example, and has an upper flange portion 16B which is loosely received in a generally cylindrical cavity 16C formed in the pick-up head 16 adjacent its lower end. The vertical length of the cavity 16C is sized such that the lower end of the suction pad 16A is substantially flush with the lower end of the pick-up head 16 upon the upper flange portion 16B of the suction pad 16A abutting against the top wall of the cavity 16C. It will be appreciated that the lower end of the suction pad 16A is normally projecting from the lower end of the pick-up head 16 because the pick-up head 16 is lowered under its own weight with the underside of its upper flange portion 16B in contact with the bottom wall of the cavity 16C. That is, the light weight suction pad 16A is depending downwardly only by its own wight.

When the suction pad 16A attracts an IC being tested thereagainst by virtue of suction force applied thereto by a vacuum pump means (not shown) following the engagement of the lower end of the pick-up head 16 with the top surface of the IC, the suction pad 16A is moved up under the suction force until the flange portion abuts against the top wall of the cavity 16C. The IC under test is thus contacted with the lower end of the pick-up head 16 while vacuum attracted and grasped by the suction pad 16A.

The carrier head 21 movable in X-Y directions is moved in the X direction (perpendicularly to the plane of drawing as viewed in FIG. 1) by means of a screw shaft or lead screw 22 (corresponding to the carrier arm 3A shown in FIGS. 4 and 5). 23 is a guide shaft to prevent the rotation of the carrier head 21 about the shaft 22.

As already stated, in the case of the tray group 2A comprising a number of trays 12 stacked in tiers on the tray stand 11, if there is deformation in each tray, the tray located at the higher tier will have a greater slant ad the altitude differences are cumulatively added up. Of course, if there are deformations in even one or more trays of the lower or intermediate tiers, the uppermost tray of the tray stack 2A would be considerably tilted. FIG. 1 illustrates an example in which the tray group 2A is supported on the tray stand 11 with its right side being significantly higher than the left side as a whole due to the right side of all or considerably many of the trays being lifted up. In FIG. 1, the reference numeral 25 indicates the horizontal plane touched by the highest part of the uppermost tray of the tray group 2A.

According to the present invention, an attitude gauging means 24 for measuring the attitude of the uppermost tray 12 of the tray group 2A is provided. The levels of a plurality of semiconductor devices placed on the tray 12 are compared with the reference level to calculate the altitude differences with respect to the reference level on the basis of the detected attitude measurements. The thus calculated altitude differences are prestored in storage means. Then, the level of a particular semiconductor device on the tray 12 to be taken out is corrected so as to be equal to the reference level by moving upwardly or downwardly the tray stand 11 on the basis of the stored altitude difference.

Figure 2:
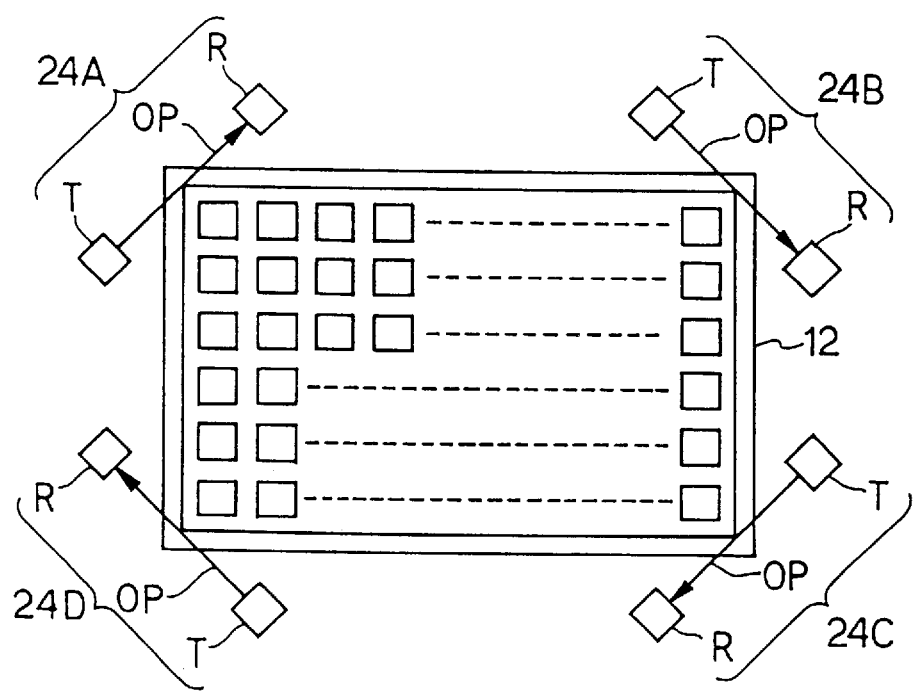
FIG. 2 is a plan view illustrating an example of the attitude gauging means employed with the semiconductor device transporting and handling apparatus of FIG. 1.

One example of the attitude gauging means is illustrated in FIG. 2. In this example, the attitude gauging means 24 comprises four sets of optical sensors 24A–24D, each set including a light emitting element T and a light receiving element R which are located in the horizontal plane 25 (see FIG. 1) touched by the highest part of the uppermost tray 12 of the tray group 2A so as to be able to detect the level of the associated one of the four corners of the uppermost tray 12.

In the course of the tray stand 11 being moved by the elevator 15 to lift the tray group 2A on the tray stand 11, the attitude gauging means constructed as described above will detect the order in which the four corners of the tray 12 intercept the light ray OP radiated from the light emitting elements T of the corresponding optical sensors 24A–24D and determine the distances travelled by the tray in its upward movement from the first interception of light to the second interception, from the second to third interceptions, and from the third to fourth interceptions.

As stated above, each of the optical sensors 24A–24D comprises the light emitting element T and light receiving element R which are located such that the light ray OP projected from the associated light emitting element T passes across the corresponding corner of the uppermost tray 12 along the horizontal plane 25 shown in FIG. 1 and received by the associated light receiving element R. With this arrangement, as the tray 12 is gradually moved up, the highest corner of the tray 12, if it is tilted, will intercept the light ray OP from the first corresponding optical sensor, then the second highest corner of the tray 12 will intercept the light ray OP from the second corresponding optical sensor, and so on. In this way, it is possible to know the orientation of the tilt of the tray 12 by detecting the order in which the interceptions of light occur. In addition, the altitude differences between the four corners can be known by determining the distances travelled upwardly by the tray between the successive interceptions of light.

The distances travelled upwardly between the successive interceptions of light can be determined by driving the pinion 14 constituting part of the elevator 15 by a pulse motor, for example, and counting the number of pulses applied to the pulse motor.

By measuring the altitude differences between the four corners of the tray, it is possible to calculate the differences in level between the top surfaces of ICs accommodated in the tray 12 (for example, differences in altitude between the top surface of the highest IC and those of the other ICs in the tray 12). The thus calculated altitude differences between the IC are prestored in storage means. At the time during the actual transportation of ICs when a particular IC being tested which the pick-up head 16 is going to pick up is identified, the altitude difference of the top surface of the identified IC to be tested is read out of the storage means, and the uppermost tray 12 is moved up or down by controlling the elevator 15 in accordance with the altitude difference as read out so as to correct the position of the tray until the distance between the level of the top surface of the IC the pick-up head 16 is going to pick up and the pick-up head 16 becomes equal to a preset constant distance.

Figure 3:
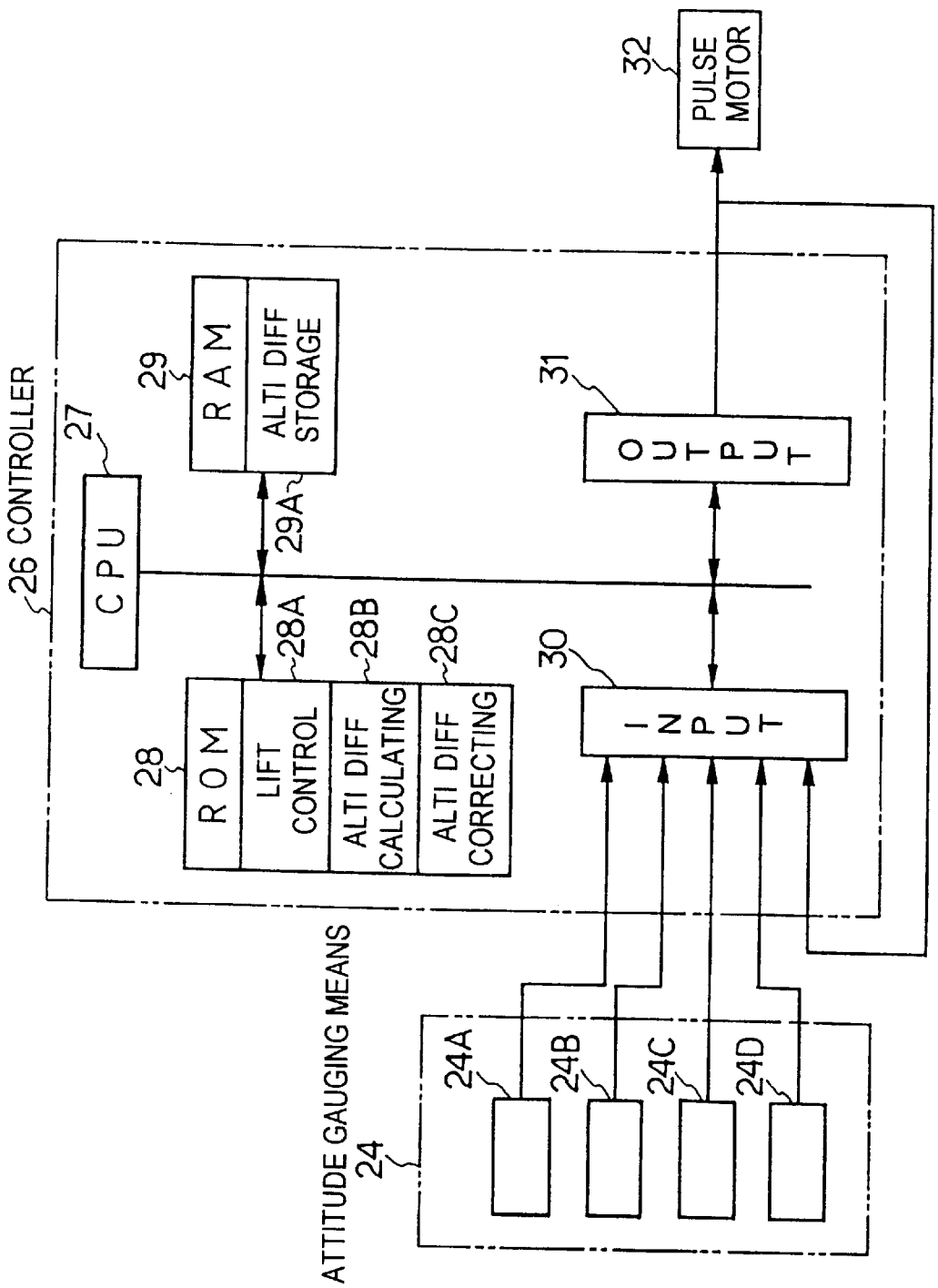
FIG. 3 is a plan view illustrating an example of the controller employed with the semiconductor device transporting and handling apparatus of FIG. 1.

FIG. 3 illustrates the circuit configuration on one example of the controller for calculating the differences between the levels of the top surfaces of a plurality of ICs in the tray 12 and a reference altitude value on the basis of the attitude values determined by the attitude gauging means and controlling the distance between the level of the IC to be tested and the pick-up head 16 by moving the tray stand 11 vertically in accordance with the calculated altitude differences so that the distance becomes equal to a preset constant distance.

The controller 25 may comprise a microcomputer, for example. As is well known in the art, the microcomputer comprises a central processing unit (CPU) 27, a read-only memory (ROM) 28 storing a program for operating the central processing unit (CPU) 27 in a predetermined sequence, a writable and readable random-access memory (RAM) 28 for temporarily storing data input from the outside, an input port 30 into which the detection signals from the light receiving elements R of the four sets of optical sensors 24A–24D of the attitude gauging means 24 are input, and an output port 31 for outputting control signals.

The control signals output from the output port 31 are pulse signals applied to a pulse motor 32 for driving the elevator 15 which pulse signals are also input to the controller 26 to be used to determine the distances travelled upwardly by the uppermost tray.

The operation of the controller 26 will now be described.

Upon the uppermost tray 12 of the tray group 2A on the tray stand 11 being emptied and transferred to the other station (buffer section), the lift control means 28A (constituted by a program prestored in the ROM 28) included in the ROM 28 is activated to supply the pulse motor 32 with pulse signals through the output port 31, whereby the pulse motor 32 is driven to actuate the elevator 15 to raise the tray stand 11 and hence the tray group 2A. During this upward movement of the tray group 2A, the detection signals from the attitude gauging means 24 are monitored.

First, the elevator 15 is actuated to raise the tray group 2A until a detection signal from any one of the optical sensors 24A–24D is input to the input port 30. The elevator 15 is further actuated to raise the tray group 2A until a detection signal from a second optical sensor is input to the input port 30 whereupon the number of the pulses generated from the time when the first detection signal was input to the time when the second detection signal is input is stored in the RAM 29. In the like manner, the elevator 15 is further actuated to raise the tray group 2A until a detection signal from a third optical sensor is input to the input port 30 whereupon the number of the pulses generated from the time when the second detection signal was input to the time when the third detection signal is input is stored in the RAM 29.

Upon a detection signal from the final (fourth) optical sensor being input to the input port 30, the number of the pulses generated from the time when the third detection signal was input to the time when the fourth detection signals input is stored in the RAM 29.

Once the detection signals from the four sets of optical sensors 24A–24D have all been input to the controller 26, supplying the pulses to the pulse motor 32 is terminated, whereby the elevator 15 is stopped to cease raising the tray group 2A.

Next, the altitude difference calculating means 28B included in the ROM 28 calculates the altitude differences between the top surfaces of ICs on the tray 12 in accordance with the data input to the input port 30 between the initiation and the termination of the upward motion of the uppermost tray 12. By way of example, the calculation may be accomplished from the altitude differences between the corners of on the tray 12 and the distances from the highest corner to each of the ICs being tested. Or alternatively, the altitude differences between the top surfaces of ICs may be calculated by drawing an imaginary tray on three-dimensional (X, Y and Z) co-ordinates from the aforesaid number of the pulses produced by the detection signals from the four sets of optical sensors 24A–24D, setting a reference point on the co-ordinates at the elevation of the corner of the tray that is first detected by the optical sensor, for example and calculating the difference in distance in the direction of the Z axis (vertical axis) between the reference point and the point on the co-ordinates of an IC to be tested to be picked up by the pick-up head 16.

The altitude differences between the top surfaces of ICs calculated by the altitude difference calculating means 28B are prestored in the altitude difference storage means 29A included in the RAM 29. And during the actual transportation of ICs to be tested out of the tray, when a particular IC to be tested which the pick-up head 16 is going to pick up is identified, the altitude difference correcting means 28C included in the ROM 28 is activated to read the altitude difference of the top surface of the identified IC being picked up by the pick-up head 16 out of the altitude difference storage means 29A, the number of pulses required to correct the read out altitude difference is calculated, and the calculated pulses are fed to the pulse motor 32 through the output port 31. The elevator 15 is thus actuated to move the tray stand 11 vertically by a distance corresponding to the number of pulses to thereby correct the level of the tray 12 on the tray stand 11.

This correction makes the distance between the forward end of the pick-up head 16 and the top surface of the IC the pick-up head 16 is going to pick up becomes equal to the preset constant value (reference value). It will thus be appreciated that the stop position of the tray stand 11 may be controlled so that the downward movement of the pick-up head 16 by a predetermined distance may bring the forward end of the suction pad 16A attached to the lower end of the pickup head 16 into slight contact with the IC the suction pad is going to pick up.

It should be noted that other than the method described above of picking up an IC to be tested by means of the suction pad 16A by slightly contacting only the suction pad with the top surface of the IC about to be picked up, there are various methods of picking up an IC to be tested by the pick-up head 16 such as the method of picking up an IC to be tested by means of the pick-up head 16 by slightly contacting the pick-up head 16 with the top surface of the IC, and the method of picking up an IC to be tested by means of the pick-up head 16 by pressing the pick-up head 16 on the top surface of the IC. In the case of the last mentioned method, the amount of pressing the pick-up head 16 down must be precisely controlled because an excessive amount of pressing would damage the IC to be tested.

While the attitude gauging means 24 has been described as comprising four sets of optical sensors 24A–24 in the foregoing embodiment, it may comprise three sets of optical sensors with the satisfactory function of measuring the attitude of the tray. In that case, preferably two of the optical sensor sets are located so as to be able to measure the levels of two diagonally opposed corners of the tray while the remaining one set is located so as to be able to measure the level of the tray as viewed in a direction passing through about the center of the tray and substantially perpendicular to the two opposed sides of the tray.

Furthermore, while in the foregoing disclosure the present invention has been described with reference to the case where the transmitting type optical sensors are used, it is also possible to measure the attitude of the tray 12 by the use of the reflecting type optical sensors in which light rays are projected onto the corners of the tray 12 such that the light rays reflected from the corners are detected to measure the distances. It should also be noted that it is possible to measure the attitude of the tray by arithmetic operations even if the optical sensors are not necessarily located in a single plane.

Figure 6:
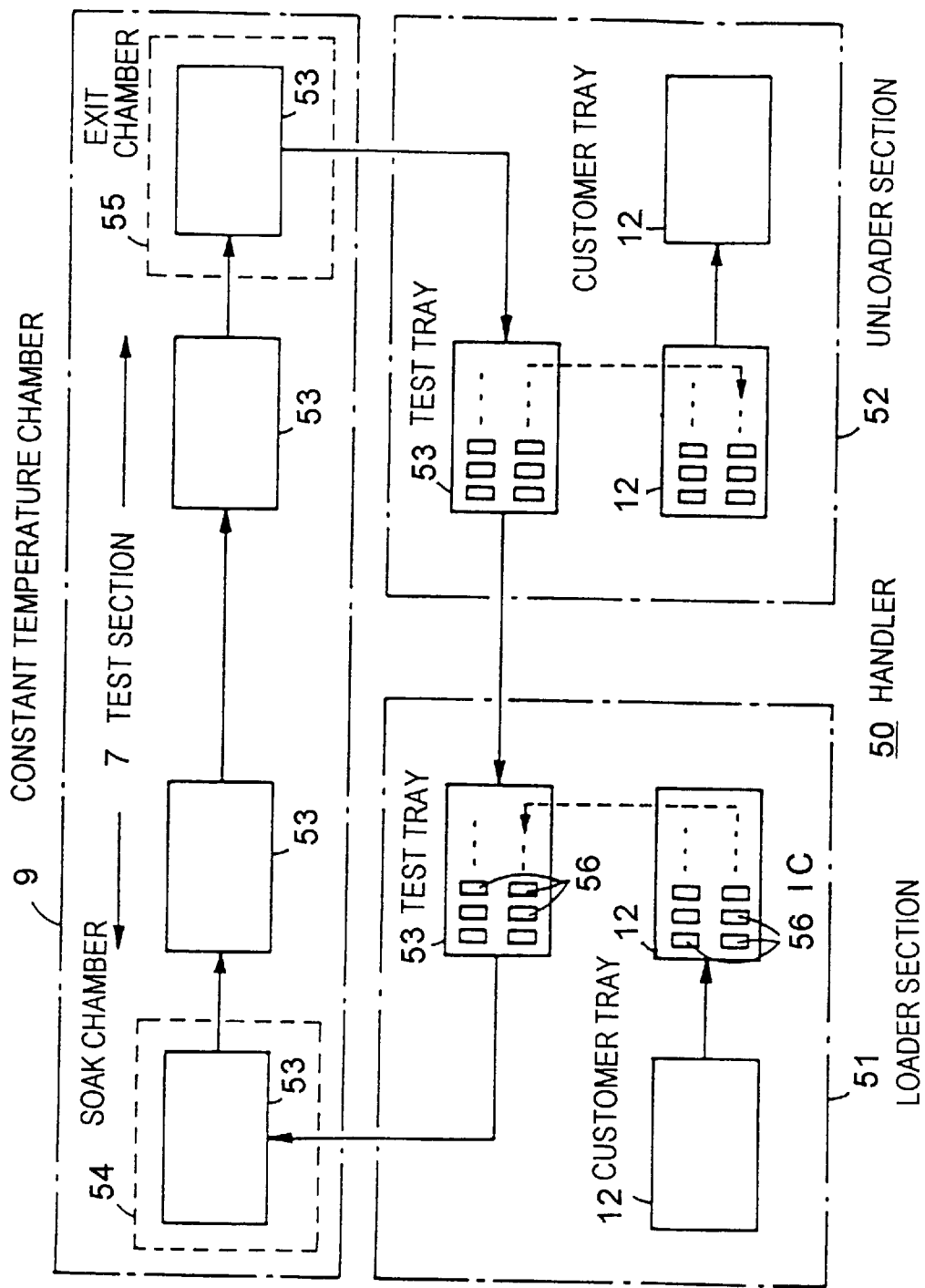
FIG. 6 is a diagrammatical view in the form of a flow chart illustrating yet another example of the conventional semiconductor device transporting and handling apparatus to which the present invention my be suitably applied.
Figure 7:
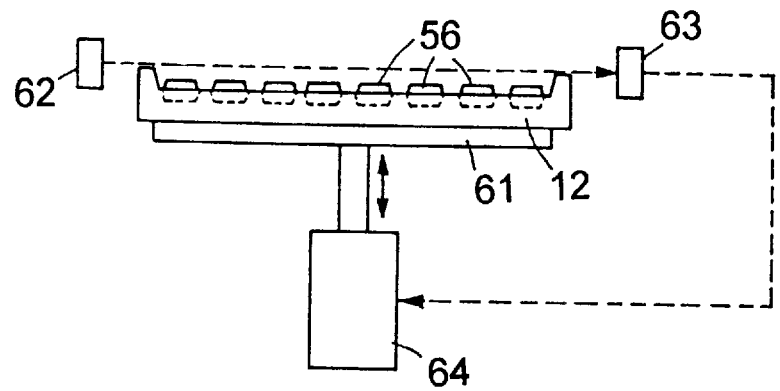
FIG. 7 is a schematic side view illustrating one example of the conventional system for detecting the top of the tray.
Figure 8:
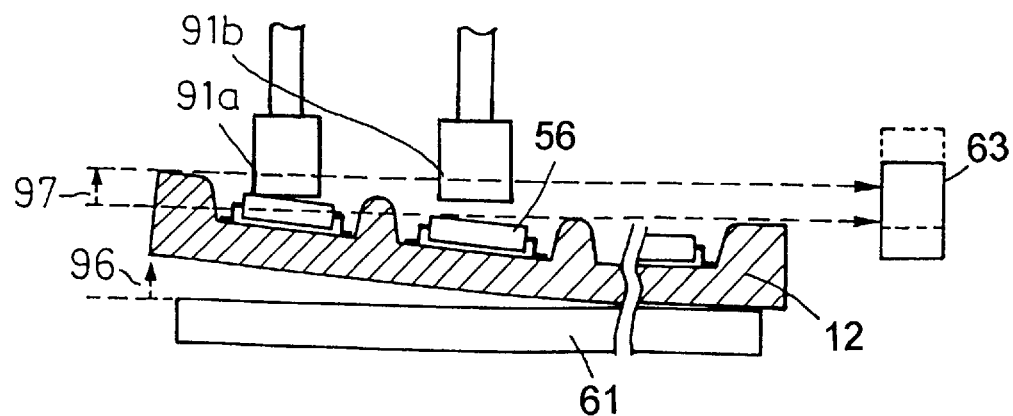
FIG. 8 is a schematic side view of the tray illustrating the problems associated with the use of the tray top detecting system shown in FIG. 7.

Moreover, while in the illustrated embodiment the present invention has been described in connection with the case where the measurement of the altitude is conducted on the uppermost tray 12 of a tray stack 2A supported on a tray stand 11 as in the handlers as illustrated in FIGS. 4 and 5, it will be apparent to those skilled in the art that the present invention may also be applicable, with the same functional advantages, to the case where a single tray 12 is placed on a tray stand 11 as in the handler as shown in FIG. 6.

In addition, while in the foregoing embodiment the present invention has been applied to the handler for transporting and handling ICs, it is a matter of course that the present invention is likewise applicable, with the same functional advantages, to handlers for transporting and handling semiconductor devices other than ICs as long as they are handlers of the type in which semiconductor devices are transported out of a tray by a carrier head.

Finally, while the foregoing embodiment has been illustrated with respect to the case where the present invention is applied to transporting semiconductor devices out of a tray 12 in the loader section, it is obvious to those skilled in the art that the present invention is not limited to the use in the loader section, but is applicable, with the same functional advantages, to taking semiconductor devices out of any tray susceptible to deformation.

As discussed hereinabove, in a semiconductor device transporting and handling apparatus in which a carrier head grasps and transports semiconductor devices out of a tray placed on a tray stand, even if the attitude of the tray is tilted due to deformations and/or distortions, the present invention provides for correcting any altitude differences resulting from the tilt between the top surfaces of the semiconductor devices on the tray and controlling the distances between the forward end of the carrier head and the top surfaces of the semiconductor devices so as to be always maintained at a constant value, whereby the downward travel of the carrier head by a constant distance ensures that the forward end of the carrier head is always stopped at such a position as to permit the carrier head to positively grasp a semiconductor device placed anywhere on the tray without imposing any excessive pressure on the device.

It will thus be appreciated that the present invention produces the advantage of providing a highly reliable semiconductor device transporting and handling apparatus which is capable of avoiding the trouble with the inability of the carrier head to grasp semiconductor devices placed in certain positions on the tray as well as the accidents such as damages and breakages caused on semiconductor devices by collision with the carrier head.

What is claimed is:

1. A semiconductor device transporting and handling apparatus in which a carrier head grasps one or more semiconductor devices out of a tray loaded with a plurality of semiconductor devices and transports it or them to a desired location, said apparatus including:

an attitude gauging means for measuring the attitude of said tray;

an altitude difference calculating means for calculating the differences between the levels of the plurality of semiconductor devices loaded on said tray and a reference altitude value on the basis of the attitude values determined by said attitude gauging means;

an altitude difference storage means for storing the altitude differences calculated by the altitude difference calculating means between the levels of the semiconductor devices and said reference altitude value;

means for reading the altitude difference of a particular semiconductor device to be transported by said carrier head with respect to said reference altitude value out of said altitude difference storage means once said particular semiconductor device has been identified; and an altitude difference correcting means for correcting the level of said identified semiconductor device so as to be equal to said reference altitude value on the basis of the attitude difference of said device with respect to said reference altitude value as read out of said altitude difference storage means.

2. The semiconductor device transporting and handling apparatus according to claim 1 in which said tray is supported on a vertically movable tray stand, said altitude difference correcting means being configured to actuate an elevator means for moving said tray stand vertically to correct the level of said identified semiconductor device on said tray so as to conform with said reference altitude value, on the basis of the attitude difference with respect to said reference altitude value read out of said altitude difference storage means.

3. The semiconductor device transporting and handling apparatus according to claim 1 in which a tray group consisting of a number of trays vertically stacked in tiers, each tray carrying a plurality of semiconductor devices thereon is supported on a vertically movable tray stand, said carrier head being adapted to transport semiconductor devices placed on the uppermost tray to the desired location, and said altitude difference correcting means being configured to actuate an elevator means for moving said tray stand vertically to correct the level of said identified semiconductor device on said uppermost tray so as to conform with said reference altitude value, on the basis of the attitude difference with respect to said reference altitude value read out of said altitude difference storage means.

4. The semiconductor device transporting and handling apparatus according to claim 2 in which said attitude gauging means comprises four sets of optical sensors, each set including a light emitting element and a light receiving element which are located in preselected positions so as to be able to detect the level of the associated one of the four corners of said tray.

5. The semiconductor device transporting and handling apparatus according to claim 3 in which said attitude gauging means comprises four sets of optical sensors, each set including a light emitting element and a light receiving element which are located in predetermined positions so as to be able to detect the level of the associated one of the four corners of the uppermost tray of said tray group on said tray stand.

6. The semiconductor device transporting and handling apparatus according to claim 4 in which said attitude gauging means is adapted to detect, in the course of the tray stand being moved by said elevator means to lift the tray on said tray stand, the order in which the four corners of the tray intercept the light ray radiated from the light emitting elements of the corresponding optical sensors and to determine the distances travelled by the tray in its upward movement from the first interception of light to the second interception, from the second to third interceptions, and from the third to fourth interceptions.

7. The semiconductor device transporting and handling apparatus according to claim 5 in which said attitude gauging means is adapted to detect, in the course of the tray stand being moved by said elevator means to lift the tray group on said tray stand, the order in which the four corners of the uppermost tray of said tray group intercept the light ray radiated from the light emitting elements of the corresponding optical sensors and to determine the distances travelled by the tray in its upward movement from the first interception of light to the second interception, from the second to third interceptions, and from the third to fourth interceptions.

8. The semiconductor device transporting and handling apparatus according to claim 1 in which said carrier head is equipped with one or more pick-up heads which are each configured to attract and grasp the semiconductor devices in said tray for transportation.

9. The semiconductor device transporting and handling apparatus according to claim 8 in which said pick-up head has a suction pad mounted to the lower portion thereof for vertical movements, said altitude difference correcting means being configured to correct the level of said identified semiconductor device placed in said tray so as to conform with said reference altitude value on the basis of the attitude difference with respect to said reference altitude value read out of said altitude difference storage means so that the forward end of said suction pad comes into contact with the top surface of said identified semiconductor device in said tray when said carrier head is lowered by a predetermined distance to pick up said identified semiconductor device in said tray.

10. The semiconductor device transporting and handling apparatus according to claim 8 in which said altitude difference correcting means is configured to correct the level of said identified semiconductor device placed in said tray so as to conform with said reference altitude value on the basis of the attitude difference with respect to said reference altitude value read out of said altitude difference storage means so that the forward end of said pick-up head comes into slight contact with the top surface of said identified semiconductor device in said tray when said carrier head is lowered by a predetermined distance to pick up said identified semiconductor device in said tray.

11. The semiconductor device transporting and handling apparatus according to claim 2 in which said attitude gauging means comprises three sets of optical sensors, two of the optical sensor sets including light emitting elements and light receiving elements which are located in preselected positions so as to be able to measure the levels of two diagonally opposed corners of the tray while the remaining one set includes a light emitting element and a light receiving elements which are located in preselected positions so as to be able to measure the level of the tray as viewed in a direction passing through about the center of the tray and substantially perpendicular to the two opposed sides of the tray.

* * * * *